(12) United States Patent
Ahmed et al.

(10) Patent No.: US 6,338,992 B1
(45) Date of Patent: Jan. 15, 2002

(54) PROGRAMMABLE READ ONLY MEMORY IN CMOS PROCESS FLOW

(75) Inventors: Shafqat Ahmed, Beaverton; Hemanshu D. Bhatt, Troutdale; Charles E. May; Robindranath Banerjee, both of Gresham, all of OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/726,107

(22) Filed: Nov. 29, 2000

(51) Int. Cl.$^7$ .......................................... H01L 21/8238

(52) U.S. Cl. ....................... 438/210; 438/201; 438/258; 438/593

(58) Field of Search ................................ 438/210, 258, 438/257, 264, 266, 201, 593

(56) References Cited

U.S. PATENT DOCUMENTS

| | | | | |
|---|---|---|---|---|
| 5,014,098 A | * | 5/1991 | Schlais et al. | 257/316 |
| 5,292,681 A | * | 3/1994 | Lee et al. | 438/201 |
| 5,474,947 A | * | 12/1995 | Chang et al. | 438/257 |
| 5,972,756 A | * | 10/1999 | Kono et al. | 438/132 |
| 6,210,999 B1 | * | 4/2001 | Gardner et al. | 438/257 |
| 6,251,729 B1 | * | 6/2001 | Montree et al. | 438/201 |
| 6,287,907 B1 | * | 9/2001 | Ito et al. | 438/201 |

* cited by examiner

*Primary Examiner*—Michael Trinh
(74) *Attorney, Agent, or Firm*—Luedeka, Neely & Graham

(57) ABSTRACT

An improvement to a process for manufacturing complementary metal oxide semiconductor devices on a monolithic substrate, where the improved process forms nonvolatile memory devices and programmable logic devices. The improvement includes exposing gate electrodes of a selected portion of the complementary metal oxide semiconductor devices at a point in the process where the gate electrodes have been previously covered by a protective material layer. A capacitive material layer is deposited on the monolithic substrate, such that it contacts the exposed gate electrodes of the selected portion of the complementary metal oxide semiconductor devices. A top electrode material layer is deposited on the monolithic substrate, such that the top electrode material layer contacts the capacitive material layer in a region overlying the exposed gate electrodes of the selected portion of the complementary metal oxide semiconductor devices. The top electrode material layer and the capacitive material layer are removed to substantially the level of the upper surface of the protective material layer, thereby leaving the top electrode layer and the capacitive material layer overlying the gate electrodes for the selected portion of the complementary metal oxide semiconductor devices. In this manner, capacitors are formed from the top electrode material layer, the capacitive material layer, and the gate electrodes of the selected portion of the complementary metal oxide semiconductor devices. The improved process further includes forming nonvolatile memory devices from the selected portion of the complementary metal oxide semiconductor devices, and forming logic devices of the complementary metal oxide semiconductor devices that are not included in the selected portion of the complementary metal oxide semiconductor devices. Fuses are formed in associated with a portion of the nonvolatile memory devices to form read only memory devices of the fused portion of the nonvolatile memory devices.

18 Claims, 5 Drawing Sheets

PROGRAMMABLE READ ONLY MEMORY IN CMOS PROCESS FLOW

FIELD

This invention relates to the field of semiconductor processing. More particularly, the invention relates to forming nonvolatile memory devices within the same process flow as and on the same substrate with logic devices.

BACKGROUND

Many products use nonvolatile memory devices to store digital information while the products are in a power off mode. One benefit of using nonvolatile memory devices is that the digital information stored in the nonvolatile memory device prior to entering a power off mode is not lost during the power off condition. Because of this favorable trait, many products use nonvolatile memory devices in combination with programmable logic devices. In this manner, the digital information stored in the nonvolatile memory devices is used to program or provide other input to the programmable logic devices. Such combinations of nonvolatile memory devices and programmable logic devices are especially useful in handheld consumer products such as cellular telephones and personal data assistants, which tend to be battery powered and thus may not have a continuous source of power, or for which it is desirable to only require a relatively low amount of power. A further benefit of this combination of nonvolatile memory devices and programmable logic devices is that the programming for the programmable logic devices that is retained within the nonvolatile memory devices is upgradeable from time to time, which thus enables the product to be updated with new versions of the software.

When implemented in a product, such as that described above, a discrete, packaged nonvolatile memory chip is typically mounted on a printed circuit board that contains the electrical connections required to connect the nonvolatile memory chip to a discrete, packaged programmable logic chip. Unfortunately, there are several disadvantages associated with this configuration. First, because two separate packaged devices are required, one for the nonvolatile memory device and another for the programmable logic device, an increased amount of surface area is required on the printed circuit board to accommodate the separately packaged devices.

Second, and again because the nonvolatile memory device is in a separate package from the programmable logic device, a longer period of time is required for the programmable logic device to access the digital information stored in the nonvolatile memory device by sending and receiving signals through the electrical connections in the printed circuit board that connects the nonvolatile memory device to the programmable logic device. Third, using multiple packaged devices tends to increase the cost of the product, because of the additional processing required to fabricate the product and because of the additional size required as a result of the separately packaged devices, as suggested above.

What is needed, therefore, is a process for fabricating a monolithic circuit that contains both nonvolatile memory components and programmable logic components on a single monolithic semiconductor substrate.

SUMMARY

The above and other needs are met by an improvement to a process for manufacturing complementary metal oxide semiconductor devices on a monolithic substrate, where the improved process forms nonvolatile memory devices and programmable logic devices. The improvement includes exposing gate electrodes of a selected portion of the complementary metal oxide semiconductor devices at a point in the process where the gate electrodes have been previously covered by a protective material layer. A capacitive material layer is deposited on the monolithic substrate, such that it contacts the exposed gate electrodes of the selected portion of the complementary metal oxide semiconductor devices.

A top electrode material layer is deposited on the monolithic substrate, such that the top electrode material layer contacts the capacitive material layer in a region overlying the exposed gate electrodes of the selected portion of the complementary metal oxide semiconductor devices. The top electrode material layer and the capacitive material layer are removed to substantially the level of the upper surface of the protective material layer, thereby leaving the top electrode layer and the capacitive material layer overlying the gate electrodes for the selected portion of the complementary metal oxide semiconductor devices. In this manner, capacitors are formed from the top electrode material layer, the capacitive material layer, and the gate electrodes of the selected portion of the complementary metal oxide semiconductor devices.

The improved process further includes forming nonvolatile memory devices from the selected portion of the complementary metal oxide semiconductor devices, and forming logic devices of the complementary metal oxide semiconductor devices that are not included in the selected portion of the complementary metal oxide semiconductor devices. Fuses are formed in association with a portion of the nonvolatile memory devices to form read only memory devices of the fused portion of the nonvolatile memory devices.

By forming nonvolatile memory devices, including read only memory devices, and logic devices on the same monolithic substrate, the invention offers several advantages. The process allows seamless integration of nonvolatile memory within a generic complementary metal oxide semiconductor fabrication process flow in a cost effective manner. The integration of nonvolatile memory and programmable logic on the same monolithic substrate saves space on printed circuit boards by reducing the need for separately packaged nonvolatile memory and programmable logic devices.

Thus, products that use such integrated monolithic circuits are able to be smaller and lighter than products that do not use such integrated monolithic circuits. Further, the monolithic circuits provide true system on a chip solutions for hand held computing device applications, which solutions result in faster memory access time, since the nonvolatile memory is located on the same chip as the programmable logic. Additionally, software stored in the nonvolatile memory is upgradeable with newer programming revisions, which increases the utile life of the products that use such monolithic circuits, thereby reducing the cost of the product as determined over the utile life of the product.

In another aspect, the invention provides a process for manufacturing a complementary metal oxide semiconductor monolithic circuit having a nonvolatile memory device and a logic device, where the logic device includes a first gate electrode, a first source electrode, and a first drain electrode, and where the nonvolatile memory device includes at least a second gate electrode. All of the electrodes of the various devices are covered by a protective material layer.

The process includes exposing the second gate electrode of the nonvolatile memory device by removing a portion of the protective material layer overlying the second gate electrode of the nonvolatile memory device. A capacitive material layer is formed adjacent and overlying the second gate electrode of the nonvolatile memory device, and a top electrode material layer is formed adjacent and overlying the capacitive material layer.

The first source electrode of the logic device and the first drain electrode of the logic device are exposed by removing portions of the protective material layer overlying the first source electrode and first drain electrode of the logic device, and forming electrical connections through the protective material layer, where the electrical connections make electrical connection with the first source electrode of the logic device and the first drain electrode of the logic device. The process further includes forming electrical contacts adjacent and overlying the top electrode material layer and the electrical connections.

In yet another aspect, the invention provides a monolithic circuit having nonvolatile memory devices and logic devices manufactured according to the above described processes.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
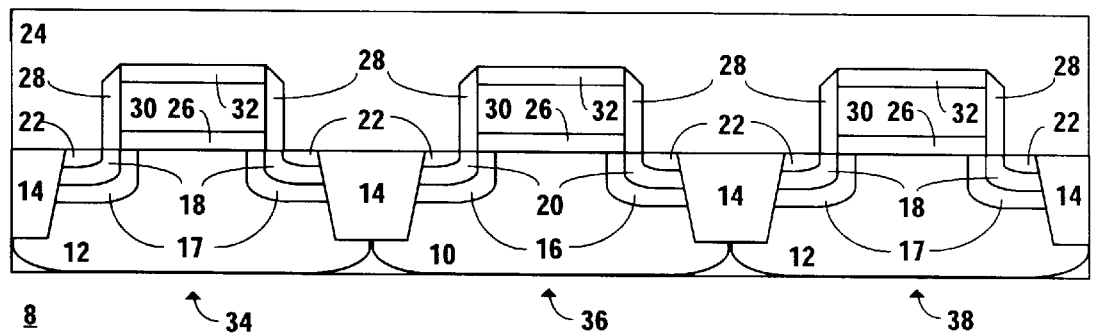
FIG. 1 is a cross sectional view of a monolithic circuit at a point in a complementary metal oxide semiconductor manufacturing process flow where the gate electrodes have been covered with a dielectric layer.

Referring now to FIG. 1, there is depicted a cross sectional view of a portion of a complementary metal oxide semiconductor circuit 8 on a monolithic silicon substrate, as it would appear after a particular point in a standard complementary metal oxide semiconductor manufacturing process. As described herein, a silicon substrate is used for the formation of the various devices. However, it is appreciated that substrates of other semiconducting material are also acceptable for application of the method of the invention as described herein. For example, substrates of germanium or gallium arsenide may also be used, with appropriate consideration given and selections made within the constraints as described below as to the other elements of the monolithic circuits that are formed.

As seen in FIG. 1, the n doped wells 10 are formed in the silicon substrate, and the p doped well 12 is also formed in the silicon substrate. The n doped wells 10 are preferably formed by implanting phosphorous into the silicon substrate, and the p doped well 12 is preferably formed by implanting boron into the silicon substrate. The shallow trench isolation structures 14 are formed of silicon oxide. P doped sources 20 and p doped drains 20 are formed in the n doped wells 10, and n doped sources 18 and n doped drains 18 are formed in the p doped well 12. Additional structures 16 may be formed by implanting an additional amount of an n doped material such as phosphorous or arsenic in regions 16 of the n doped wells 10, to reduce leakage and punch through in the devices to be formed. Similarly, additional structures 17 may be formed by implanting an additional amount of a p doped material such as indium or boron in regions 17 of the p doped wells 12, again to reduce leakage and punch through in the device to be formed.

Source and drain contacts 22 are formed in the sources 18 and 20 and the drains 18 and 20, such as by forming a silicide of cobalt, titanium, or nickel. Sources 18 and 20 and drains 18 and 20 are given the same reference numbers herein, because in many different types of devices, sources are distinguished from drains more by the direction in which current ultimately flows through the circuit, and less by the physical structure of the sources or the drains. Thus, the specific designation of which of the structures constitute sources and which of the structures constitute drains is immaterial to the description of the method according to the invention at this point in time. However, for nonvolatile flash memory devices, source and drain structures may be differently engineered, such as to enhance injection efficiency.

Gate oxide 26 is preferably thermally grown and patterned over the gate regions of the wells 10 and 12, and polysilicon gates 30 are formed atop the gate oxide layer 26. Gate electrodes 32 are formed on the polysilicon gates 30, such as by forming a silicide of a metal such as cobalt, titanium, or nickel. A protective sidewall layer 28 such as silicon oxide or silicon nitride is formed adjacent the gate oxide layer 26, the gate electrode layer 30, and the gate electrode 32.

In an alternate embodiment, the formation of the electrode contacts 22 and 32 are formed in a self aligned silicide process, also known as a salicide process. In this embodiment, the protective sidewall layer 28 is formed prior to forming any of the contacts 22 and 32. After depositing the material of the protective sidewall layer 28, the material of the protective sidewall layer 28 is etched away from the substrate, except in the places where it is desired to form the protective sidewall spacers 28.

A layer of a metallic material, such as a titanium, is deposited across the surface of the substrate. After depositing the metallic material, the metallic material is annealed to form a silicide with the exposed silicon material in the source and drain regions 18 and 20 and the exposed polysilicon gates 30. In the specific example where titanium is used as the metallic material, the anneal is preferably performed in a nitrogen atmosphere, so that titanium nitride compounds or titanium oxynitride compounds are formed on surfaces other than those of silicon or polysilicon. These compounds are then removed, such as by a wet etch, which leaves the titanium silicide contacts 22 and 32 behind. The contacts 22 and 32 formed in this manner can then be further annealed to reduce sheet resistance.

A dielectric layer 24 is formed over all of the structures described above. The dielectric layer 24 is formed of materials such as silicon oxide, phosphosilicate glass, or borophosphosilicate glass. The dielectric layer 24 function as both a protective layer to the devices and structures previously formed beneath the dielectric layer 24, and also as an electrically insulating layer between the devices and structures below the dielectric layer 24, and the electrical connections that are typically formed above the dielectric layer 24. These processes as described above generally define PMOS device 36 and NMOS devices 34 and 38, which are substantially completed at this point in the processing, except that electrical connections to the devices have not as yet be formed.

It is appreciated that the structures and materials as generally given above are by way of example only and that in actual configuration either additional structures may be formed in the devices as described above or some of the structures as described above, such as the protective sidewall layers 28 and other structures, may not be formed at all. Further, additional processing, not described above, is needed to produce the structures described and depicted in FIG. 1. In addition, the number and arrangement of the NMOS device 34 and the NMOS device 38 is purely representative. It is therefore appreciated that the discussion as given above is intended to provide an introduction and setting to the various additional elements of the invention as given in the different embodiments described below, and is not in any way intended to limit the scope of the invention.

Further, although only three devices 34, 36, and 38 are depicted in the circuit 8, it is appreciated that these three devices are representative of perhaps millions of similar devices that may also reside on the same monolithic chip. During further processing according to the invention, as described in detail hereafter, the PMOS device 36 and the NMOS device 38 are completed to form a complementary metal oxide semiconductor logic device, and the NMOS device 34 is completed to form a nonvolatile memory device. Once again, this selection is representational only, and is not intended to limit the scope of the invention.

Further, the NMOS device 34 that is to be a nonvolatile memory device is depicted in the figures as residing directly alongside the PMOS device 36 that is to be a part of the complementary metal oxide semiconductor logic device. This selection of location and arrangement is also merely representational, and other configurations and arrangement are also within the scope of the invention as described below. However, the specific configuration as given in the figures is sufficient to adequately explain the nature of the present invention.

Figure 2:
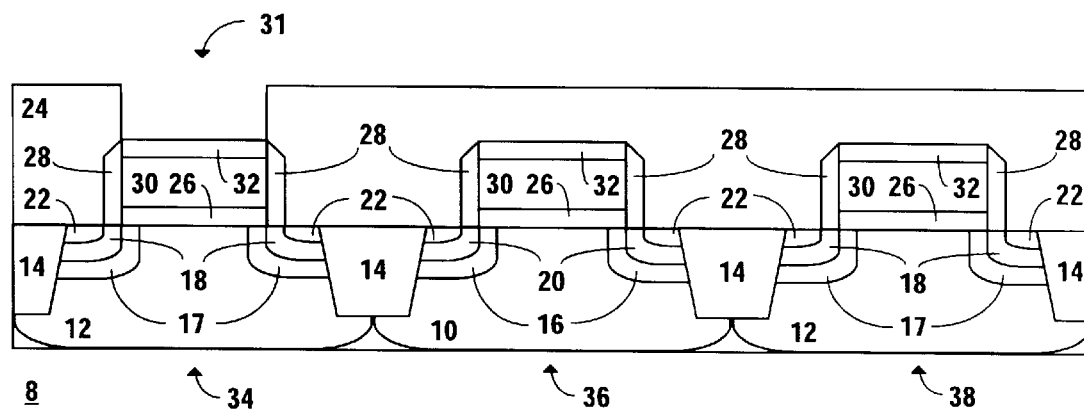
FIG. 2 is a cross sectional view of a monolithic circuit at a point in a complementary metal oxide semiconductor manufacturing process flow where a contact has been etched to the gate electrodes of a portion of the devices.

With reference now to FIG. 2, the protective material layer 24 directly overlying the gate electrode 32 of the device 34 is removed. This is accomplished according to one or more of a number of different methods, such as by masking with photoresist the portions of the protective material layer 24 that are not to be removed, patterning the photoresist mask, wet or dry etching the protective material layer 24 down to the gate electrode 32, and then removing the photoresist mask. Thus, FIG. 2 depicts the resultant etched region 31 that is formed at the completion of the representative steps described above.

Figure 3:
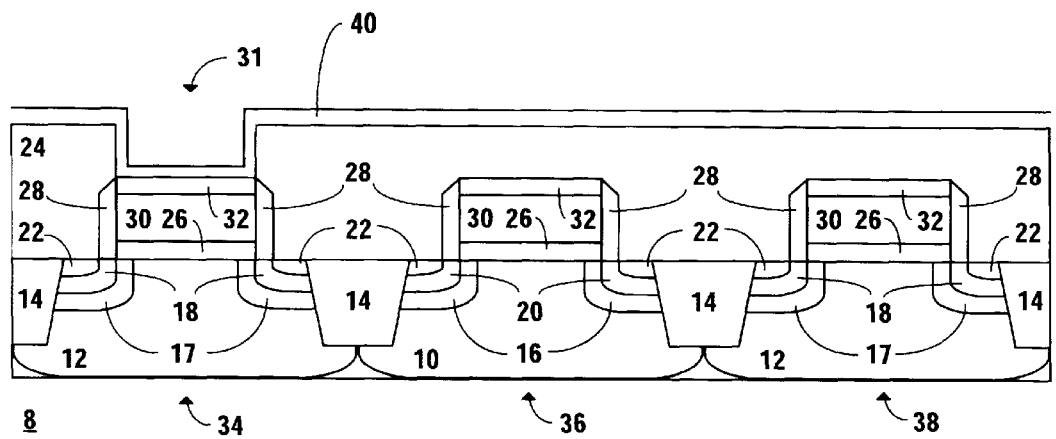
FIG. 3 is a cross sectional view of a monolithic circuit at a point in a complementary metal oxide semiconductor manufacturing process flow where the gate electrodes for a portion of the devices have been covered with a capacitive layer.

As depicted in FIG. 3, a dielectric layer 40 is deposited over the entire surface of the monolithic circuit 8. The dielectric layer 40 is also referred to herein as a capacitive material layer 40, which more particularly indicates the eventual intended function of the capacitive material layer 40, as described more fully below. The capacitive material layer 40 overlies the protective material layer 24 and the exposed gate electrode 32 within the etched region 31. In the preferred embodiment, the capacitive material layer 40 is silicon oxide, phosphosilicate glass, or borophosphosilicate glass. The capacitive material layer 40 may be formed according to one or more of a number of different methods, such as chemical vapor deposition or physical vapor deposition, such as sputtering. Preferably, the capacitive material layer 40 is between about 100 angstroms thick and about 1,000 angstroms thick, and is most preferably about 300 angstroms thick.

Figure 4:
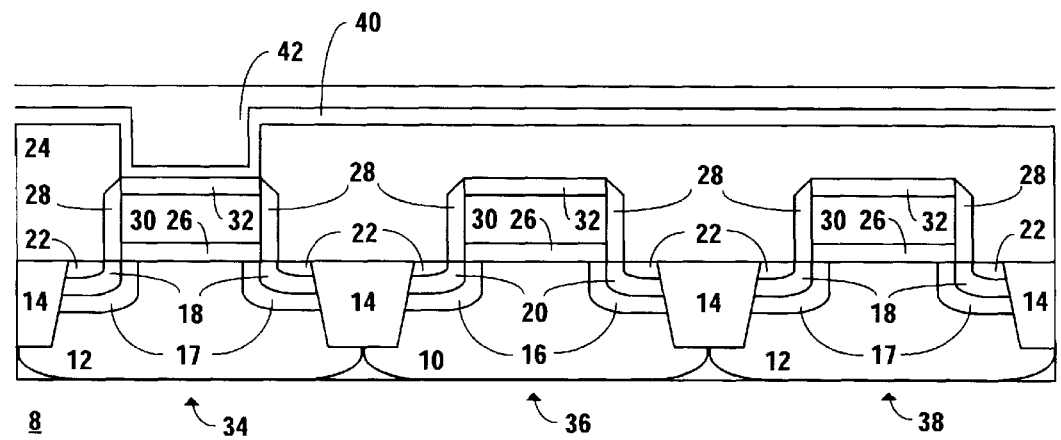
FIG. 4 is a cross sectional view of a monolithic circuit at a point in a complementary metal oxide semiconductor manufacturing process flow where the gate electrodes for a portion of the devices have been covered with a top electrode layer.

A top electrode layer 42, preferably consisting of an electrically conductive material such as a metallic material like tungsten, copper, titanium, titanium nitride, or some combination thereof is deposited over the capacitive material layer 40. The top electrode layer 42 may be deposited according to one or more of a number of different methods such as chemical vapor deposition, or more preferably by sputtering. The top electrode layer 42 is preferably deposited to a thickness of between about 1,500 angstroms and about 6,000 angstroms, and most preferably about 3,000 angstroms. After this step, the monolithic circuit 8 appears as depicted in FIG. 4.

Figure 5:
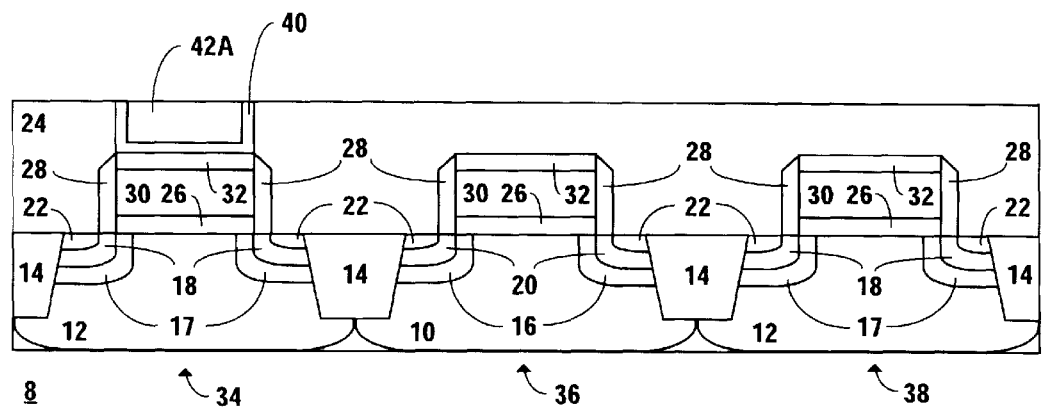
FIG. 5 is a cross sectional view of a monolithic circuit at a point in a complementary metal oxide semiconductor manufacturing process flow where the circuit has been planarized.

As depicted in FIG. 5, the top electrode layer 42 and the capacitive material layer 40 are removed from the surface of the monolithic circuit 8 to a level that is substantially at or near the top of the preexisting surface of the protective material layer 24. Preferably, all of the top electrode layer 42 and all of the capacitive material layer 40 are removed from atop the protective material layer 24. In this manner, the only portions of the tope electrode layer 42 and the capacitive material layer 40 that remain on the monolithic circuit 8 are within the recess 31, which overlies the gate electrode 32 of the circuit 34. The portion of the top electrode layer 42 that remains at this point is also referred to herein as the control electrode 42a. The top electrode layer 42 is removed by one or more of a number of different methods, such as by masking with a photoresist layer and then wet etching or dry etching. In alternate embodiments the top electrode layer 42 is removed by chemical mechanical polishing.

The circuit 8 is masked, such as with a photoresist material, and then patterned and etched to form contacts through the protective material layer 24. The contacts formed in this manner extend down from the surface of the protective material 24 to the source electrodes 22 and the drain electrodes 22. The contacts are filled with a conductive material, such as a metallic material like tungsten, copper, titanium, titanium nitride, or a combination of such materials. The conductive material within the contacts form electrical connections 44.

Figure 6:
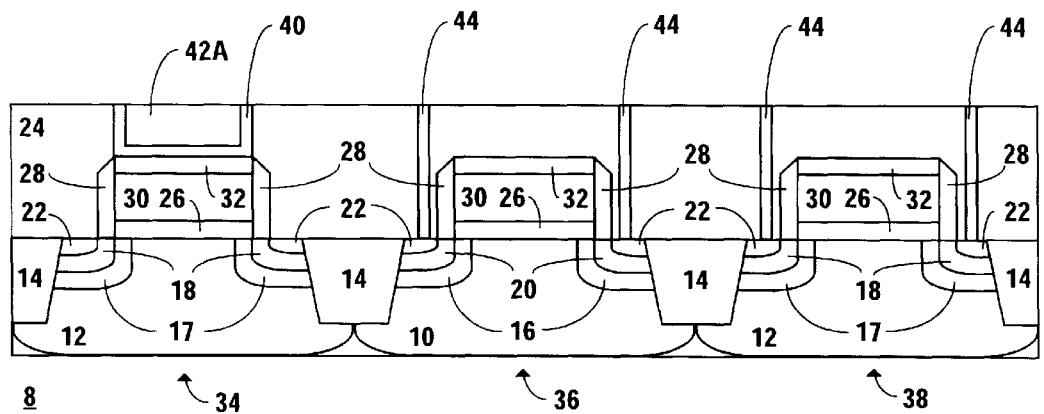
FIG. 6 is a cross sectional view of a monolithic circuit at a point in a complementary metal oxide semiconductor manufacturing process flow where metal interconnects have been formed in the dielectric layer.

As shown in FIG. 6, the electrical connections 44 extend through the protective material layer 24 to make electrical contact with the source electrodes 22 and the drain electrodes 22. Although not shown in the embodiment given in FIG. 6, the nonvolatile memory device 34 also preferably receives electrical connections 44 that make electrical connection to the source electrode 22 and the drain electrode 22 of the nonvolatile memory device 34. The electrical connections 44 within the contacts may be formed by depositing the electrically conductive material using any one or more of a number of different processes such as chemical vapor deposition and physical vapor deposition.

Figure 7:
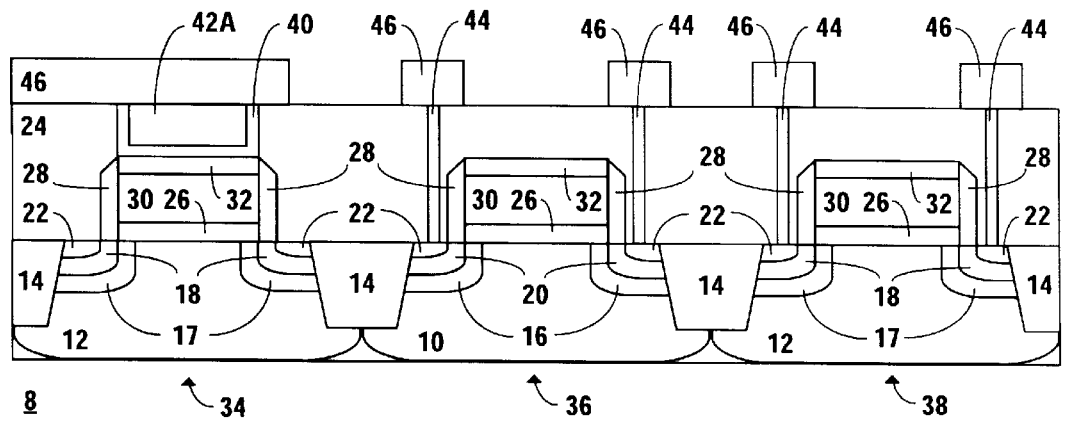
FIG. 7 is a cross sectional view of a monolithic circuit at a point in a complementary metal oxide semiconductor manufacturing process flow where contacts have been formed on the metal interconnects in the dielectric layer.

A contact material layer 46 is deposited over the protective material layer 24, the electrical connections 44, and the control gate electrode 42a, as depicted in FIG. 7. The contact material layer is formed of an electrically conductive material, such as a metallic material like aluminum or an alloy of aluminum. Preferably, the contact material layer 46 is deposited using one or more of a variety of different methods, such as chemical vapor deposition or physical vapor deposition, like evaporation or sputtering.

The contact material layer 46 is patterned, such as with a layer of photoresist, and etched to form electrical contacts and interconnects as depicted in FIG. 7. Preferably, electrical connections and electrical contacts are also formed to make electrical contact to the gates 32 of the programmable logic devices 36 and 38. These electrical connections and electrical contacts are not shown in the embodiment depicted in FIG. 7. However, such additional electrical connections and electrical contacts are formed according to methods that are substantially similar to those described above.

In use, the gate 30 of the nonvolatile memory device 34 acts as a floating gate. Depending upon the voltage level applied to the control gate 42a, the capacitive material 40 either accepts a capacitive charge or discharges a capacitive charge. When the capacitive material 40 accepts a capacitive charge, the gate 30 of the nonvolatile memory device 34 is energized, which exerts an influence on the channel region of the nonvolatile memory device 34. When the capacitive material 40 discharges a capacitive charge, the gate 30 of the nonvolatile memory device 34 is not energized, and consequently does not exert an influence on the channel region of the nonvolatile memory device 34.

Once the capacitive material 40 either accepts a capacitive charge or discharges a capacitive charge, it tends to retain either the charged or discharged state to which it has been set. In other words, the capacitive material 40 retains either the charged state or the discharged state to which it has been set until another voltage signal is received by the control electrode 42a. Further, the voltage signals received by the control electrode 42a do not need to be persistent in order for the state of the capacitive material 40 to endure. Preferably, the voltage signals received by the control electrode 42a are in the form of pulses, with a duration that is only long enough to sufficiently charge or discharge the capacitive material layer 40, which then retains the state to which has been set until a pulse of a differing voltage is received.

Thus, the device 34 forms a nonvolatile memory device that may be reprogrammed based on the voltage applied to the control gate electrode 42a. In this manner, electrical continuity between the source electrode 22 of the nonvolatile memory device 34 and the drain electrode 22 of the nonvolatile memory device 34 can be either maintained or curtailed for indefinite periods of time as desired by sending a single electrical pulse of a desired voltage level to the control electrode 42a. The stored charge in the floating gate is preferably used to define the state of the nonvolatile memory device 34, and its turn on behavior.

Figure 8:
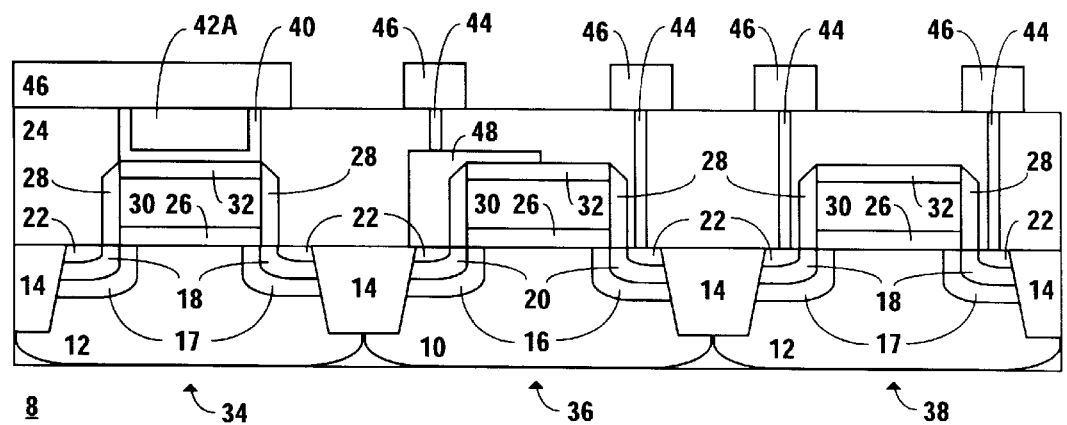
FIG. 8 is a cross sectional view of an alternate embodiment of the monolithic circuit of FIG. 7.

In an alternate process according to the invention, the result of which is depicted in FIG. 8, a mask and etching process is performed to form a clamp electrode 48 between the source electrode 22 and the gate electrode 32 of the PMOS device 36. Electrical connections 44 and electrical contacts 46 are formed as previously described. Thus, the process as described above is able to include other complementary metal oxide semiconductor processes and configurations, other than those as specifically recited above.

Figure 9:
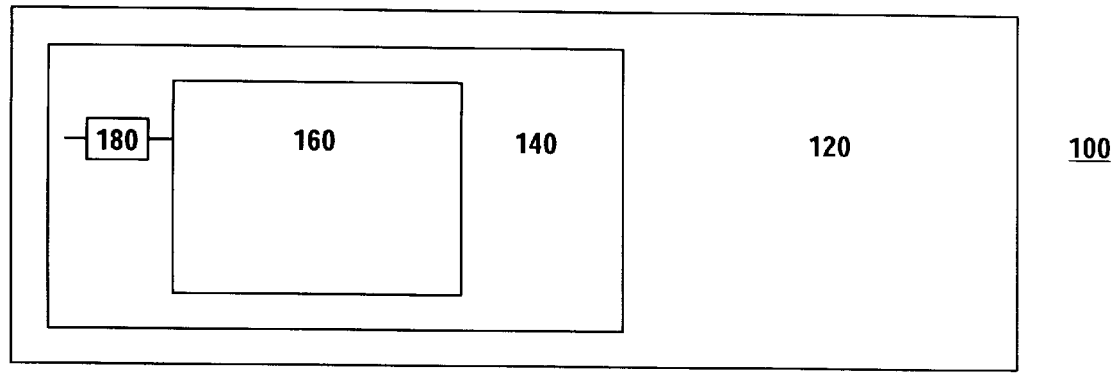
FIG. 9 is a depiction of the different blocks of logic devices, nonvolatile memory devices, and programmable read only memory devices present in a single monolithic integrated circuit.

Referring now to FIG. 9, there is depicted a functional representation of an integrated circuit 100. The integrated circuit 100 is formed on a single monolithic substrate, and thus tends to have none of the drawbacks associated with circuits that are formed on separate substrates, as described elsewhere herein. For example, the integrated circuit 100 is preferably formed on a single monolithic silicon substrate. The integrated circuit 100 takes the benefits of a block of logic devices 120 that is integrated with a block of nonvolatile memory devices 140 on a single substrate, as described above, a step further and forms on the same substrate an integrated block of programmable read only memory devices 160 from a portion of the block of nonvolatile memory devices 140.

The programmable read only memory 160 is preferably formed by fashioning a fuse 180 that is associated with the programmable read only memory 160. In a preferred embodiment, the programmable read only memory 160 is programmed as desired, and then the fuse is blown, essentially locking the programmable read only memory 160 in its preferred programmed state. It is appreciated that the fuse 180 may be associated with the programmable read only memory 160 in other ways. Thus, the fuse 160 may act as a severable electrical link to various portions of the programmable read only memory device 200, in a configurable manner.

Figure 10:
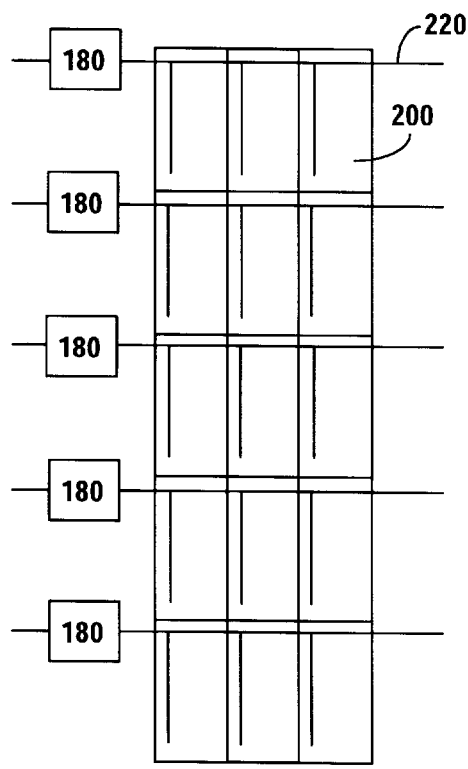
FIG. 10 is a functional diagram of a second fusing embodiment for the programmable read only memory.

FIG. 10 depicts a second fusing embodiment for the programmable read only memory devices 200, which are essentially nonvolatile memory devices 34 that are associated with fuses 180. In this embodiment, rather than associating a single fuse 180 with the entire block 160 of the programmable read only memory devices 200, a fuse 180 is associated with each logical line 220, such as a word line, leading to a set of programmable read only memory devices 200, which thus associates all of the programmable read only memory devices 200 on the logical line 220 with one of the fuses 180. This configuration makes smaller portions of the programmable read only memory block 160 addressably programmable at a given time.

Figure 11:
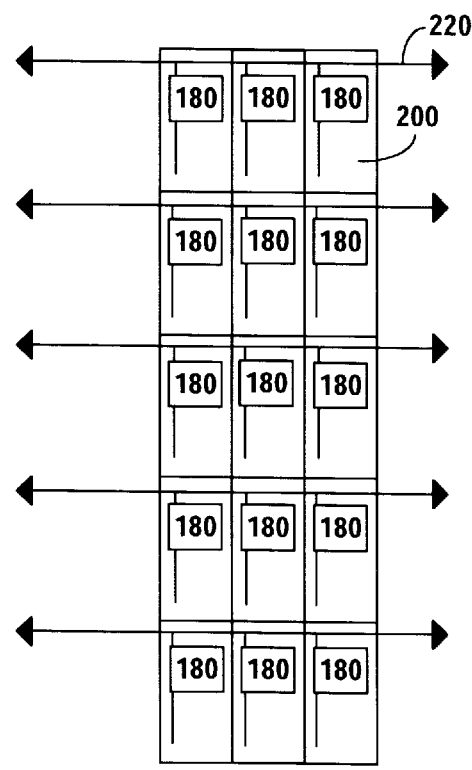
FIG. 11 is a functional diagram of a third fusing embodiment for the programmable read only memory.

FIG. 11 depicts a third fusing embodiment, in which each of the programmable read only memory devices 200 is associated with a unique fuse 180. In this embodiment, each of the individual programmable read only memory devices 200 is individually addressable and programmable. Thus, as depicted, there are several fusing embodiments by which portions of the nonvolatile memory devices 34 may be converted into programmable read only memory devices 200.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a process for manufacturing complementary metal oxide semiconductor devices on a monolithic substrate, where the complementary metal oxide semiconductor devices each have a gate electrode, the improvement comprising:
    (a) exposing the gate electrodes of a selected portion of the complementary metal oxide semiconductor devices at a point in the process where the gate electrodes have been previously covered by a protective material layer, where the protective material layer has an upper surface at a level,
    (b) depositing a capacitive material layer on the monolithic substrate, the capacitive material layer thereby contacting exposed gate electrodes of the selected portion of the complementary metal oxide semiconductor devices,
    (c) depositing a top electrode material layer on the monolithic substrate, the top electrode material layer thereby contacting the capacitive material layer in a region overlying the exposed gate electrodes of the selected portion of the complementary metal oxide semiconductor devices,
    (d) removing the top electrode material layer and the capacitive material layer to substantially the level of the upper surface of the protective material layer, thereby leaving the top electrode layer and the capacitive material layer overlying the gate electrodes for the selected portion of the complementary metal oxide semiconductor devices, and thereby forming capacitors comprising the top electrode material layer, the capacitive material layer, and the gate electrodes of the selected portion of the complementary metal oxide semiconductor devices, and
    (e) forming nonvolatile memory devices from the selected portion of the complementary metal oxide semiconductor devices,
    (f) forming fuses associated with a portion of the nonvolatile memory devices to form programmable read only memory of the fused portion of the nonvolatile memory devices, and
    (g) forming logic devices of the complementary metal oxide semiconductor devices not included in the selected portion of the complementary metal oxide semiconductor devices.

2. The process of claim 1 wherein step (a) further comprises masking the protective material layer and selectively etching through the protective material layer down to the second gate electrode.

3. The process of claim 1 wherein step (b) further comprises depositing the capacitive material layer selected from the group consisting of silicon dioxide, phosphosilicate glass, and borophosphosilicate glass.

4. The process of claim 1 wherein step (c) further comprises depositing a material selected from the group consisting of tungsten, copper, titanium, and titanium nitride.

5. The process of claim 1 wherein step (d) further comprises selectively removing the top electrode material layer by chemical mechanical polishing.

6. The process of claim 1 wherein step (d) further comprises selectively removing the top electrode material layer by masking and selectively etching the top electrode material layer.

7. A process for manufacturing a complementary metal oxide semiconductor monolithic circuit having a programmable read only memory device and a logic device, where the logic device includes a first gate electrode, a first source electrode, and a first drain electrode, where the programmable read only memory device includes at least a second gate electrode, and where the first and second gate electrodes, the first source electrode, and the first drain electrode are covered by a protective material layer, the process comprising:
    (a) exposing the second gate electrode by removing a portion of the protective material layer overlying the second gate electrode,
    (b) forming a capacitive material layer adjacent and overlying the second gate electrode,
    (c) forming a top electrode material layer adjacent and overlying the capacitive material layer,
    (d) exposing the first source and first drain electrodes by removing portions of at least the protective material layer overlying the first source and first drain electrodes,
    (e) forming electrical connections through the protective material layer, the electrical connections making electrical connection with the first source and first drain electrodes,
    (f) forming electrical contacts adjacent and overlying the top electrode material layer and the electrical connections, and
    (g) forming a fuse associated with the programmable read only memory device.

8. The process of claim 7 wherein step (a) further comprises masking the protective material layer and selectively etching through the protective material layer down to the second gate electrode.

9. The process of claim 7 wherein step (b) further comprises forming the capacitive material layer by depositing a material selected from the group consisting of silicon dioxide, phosphosilicate glass, and borophosphosilicate glass.

10. The process of claim 7 wherein step (c) further comprises forming the top electrode material layer by depositing a material selected from the group consisting of tungsten, copper, titanium, and titanium nitride.

11. The process of claim 7 wherein step (d) further comprises masking the protective material layer and selectively etching through the protective material layer down to the first source and first drain electrodes.

12. The process of claim 7 wherein step (f) further comprises:
    (f1) depositing a metal stack based on one of aluminum technology and copper technology to form a contact material layer overlying and adjacent the top electrode material layer and the electrical connections, and
    (f2) masking and selectively etching the contact material layer to form the contacts adjacent and overlying the top electrode material layer and the electrical connections.

13. The process of claim 7 wherein step (b) further comprises forming the capacitive material layer adjacent and overlying the protective material layer and the second gate electrode.

14. The process of claim 13 wherein step (c) further comprises:

(c1) forming the top electrode material layer adjacent and overlying the capacitive material layer, and (c2) selectively removing the top electrode material layer except where the top electrode material layer overlies the second gate electrode.

15. The process of claim 14 wherein step (c2) further comprises selectively removing the top electrode material layer by chemical mechanical polishing.

16. The process of claim 14 wherein step (c2) further comprises selectively removing the top electrode material layer by masking and selectively etching the top electrode material layer.

17. The process of claim 14 wherein:

step (d) further comprises masking the capacitive material layer and selectively etching through the protective material layer and the capacitive material layer down to the first source and first drain electrodes, and step (e) further comprises forming the electrical connections through the protective material layer and the capacitive material layer, the electrical connections making electrical connection with the first source and first drain electrodes.

18. A process for manufacturing a complementary metal oxide semiconductor monolithic circuit having a programmable read only memory device and a logic device, where the logic device includes a first gate electrode, a first source electrode, and a first drain electrode, where the programmable read only memory device includes at least a second gate electrode, and where the first and second gate electrodes, the first source electrode, and the first drain electrode are covered by a protective material layer, the process comprising:

(a) exposing the second gate electrode by masking the protective material layer and selectively etching through the protective material layer down to the second gate electrode, (b) depositing a capacitive material layer adjacent and overlying the protective material layer and the second gate electrode, the capacitive material layer selected from the group consisting of silicon dioxide, phosphosilicate glass, and borophosphosilicate glass, (c) forming a top electrode material layer adjacent and overlying the capacitive material layer by:

(c1) depositing a material selected from the group consisting of tungsten, copper, titanium, and titanium nitride adjacent and overlying the capacitive material layer, and (c2) selectively removing the top electrode material layer except where the top electrode material layer overlies the second gate electrode, (d) exposing the first source and first drain electrodes by masking the capacitive material layer and selectively etching through the capacitive material layer and the protective material layer down to the first source and first drain electrodes, (e) forming electrical connections through the protective material layer and the capacitive material layer, the electrical connections making electrical connection with the first source and first drain electrodes, (f) forming electrical contacts adjacent and overlying the top electrode material layer and the electrical connections by:

(f1) depositing a metal stack based on one of aluminum technology and copper technology to form a contact material layer overlying and adjacent the top electrode material layer and the electrical connections, and (f2) masking and selectively etching the contact material layer to form the contacts adjacent and overlying the top electrode material layer and the electrical connections.

(h) forming a fuse associated with the programmable read only memory device.

\* \* \* \* \*